United States Patent
Van Kampen et al.

(10) Patent No.: US 9,443,658 B2
(45) Date of Patent: Sep. 13, 2016

(54) VARIABLE CAPACITOR COMPROMISING MEMS DEVICES FOR RADIO FREQUENCY APPLICATIONS

(71) Applicant: CAVENDISH KINETICS, INC., San Jose, CA (US)

(72) Inventors: Robertus Petrus Van Kampen, S-Hertogenbosch (NL); Richard L. Knipe, McKinney, TX (US)

(73) Assignee: Cavendish Kinetics, Inc., San Jose, CA (US)

( * ) Notice: Subject to any disclaimer, the term of this patent is extended or adjusted under 35 U.S.C. 154(b) by 109 days.

(21) Appl. No.: 14/420,152

(22) PCT Filed: Aug. 7, 2013

(86) PCT No.: PCT/US2013/053888
§ 371 (c)(1),
(2) Date: Feb. 6, 2015

(87) PCT Pub. No.: WO2014/025844
PCT Pub. Date: Feb. 13, 2014

(65) Prior Publication Data
US 2015/0235771 A1    Aug. 20, 2015

Related U.S. Application Data

(60) Provisional application No. 61/682,124, filed on Aug. 10, 2012.

(51) Int. Cl.
*H01G 5/16* (2006.01)
*H01G 5/38* (2006.01)

(52) U.S. Cl.
CPC . *H01G 5/16* (2013.01); *H01G 5/38* (2013.01)

(58) Field of Classification Search
None
See application file for complete search history.

(56) References Cited

U.S. PATENT DOCUMENTS

| | | | | |
|---|---|---|---|---|
| 7,276,990 | B2* | 10/2007 | Sievenpiper | H01P 1/10 333/101 |
| 7,298,228 | B2* | 11/2007 | Sievenpiper | H01P 1/10 333/101 |

(Continued)

FOREIGN PATENT DOCUMENTS

| WO | 2010/054244 A2 | 5/2010 |
|---|---|---|
| WO | 2013185325 A1 | 12/2013 |

OTHER PUBLICATIONS

Abbaspour-Tamijani A.: "Miniature and Tunable Filters Using MEMS Capacitors", IEEE Transactions on Microwave Theory and Techniques, vol. 51, No. 7, dated Jul. 1, 2003.

(Continued)

*Primary Examiner* — Dion R Ferguson
(74) *Attorney, Agent, or Firm* — Patterson & Sheridan, LLP

(57) ABSTRACT

A variable capacitor (300) comprises cells (200, 400) that have an RF electrode (202, 402) coupled to a bond pad (30). Each cell comprises a plurality of MEMS devices (100) the capacitance of which can be changed by means of a movable electrode. The MEMS devices are placed in a sealed cavity of the cell and are arranged next to each other along the length of the RF electrode of the cell. The RF electrode of each cell can be trimmed so as to obtain an RF line (402) and a further ground electrode (404) and so as to scale the RF capacitance of the cell without impacting the mechanical performance of the MEMS cells. Each cell has the same control capacitance irrespective of the RF capacitance. This allows each cell to use the same isolation resistor required for RF operation and thus each cell has the same parasitic capacitance. This allows the CMOS control circuit to be optimized and the dynamic performance of the cells to be matched.

20 Claims, 4 Drawing Sheets

(56) References Cited

U.S. PATENT DOCUMENTS

| | | |
|---|---|---|
| 9,076,808 B2 * | 7/2015 | Gaddi |
| 2009/0185325 A1 | 7/2009 | Park et al. |
| 2014/0218839 A1 * | 8/2014 | Gaddi .................... H01G 5/16 361/278 |
| 2014/0300249 A1 * | 10/2014 | Van Kampen ...... B81C 1/00039 310/300 |
| 2014/0300404 A1 * | 10/2014 | Gaddi ..................... H01G 5/18 327/382 |

OTHER PUBLICATIONS

International Search Report and Written Opinion issued in corresponding application PCT/US2013/053888, mailed Sep. 30, 2013.

* cited by examiner

VARIABLE CAPACITOR COMPROMISING MEMS DEVICES FOR RADIO FREQUENCY APPLICATIONS

BACKGROUND OF THE INVENTION

1. Field of the Invention

Embodiments of the present invention generally relate to a variable capacitor for radio frequency (RF) and microwave applications.

2. Description of the Related Art

As the size of semiconductors continues to shrink, so does the micro-electromechanical systems (MEMS) that are coupled to the semiconductors. MEMS devices may be used in miniature relay switches, capacitance switches, non-volatile memory elements and for many more applications. The MEMS devices have a suspended structure that moves between at least two positions to modify the electrical impedance to the flow of continuous or alternate current.

The MEMS devices may be built over complementary metal oxide semiconductor (CMOS) devices. MEMS devices are made using similar processing steps to those found in semiconductor foundries and therefore can be manufactured cost effectively on a wafer scale. Some of the issues that arise in MEMS devices include unwanted capacitive coupling, series inductance and losses. The MEMS devices may be disposed in cell or bitcells to collectively form a DVC. A DVC may be controlled in a binary fashion to generate an RF capacitance ranging from Cmin to Cmax. Many small MEMS switches may be combined in one cavity which are all actuated at the same time. Bitgroups are generated by either combining multiple cells, with e.g. 2×, 4×, 8×, etc. . . . the number of switches, or by using partial cells, e.g. with only ½, ¼ or ⅛ the number of switches in the cell.

The capacitance of the DVC may be customized to have a specific capacitance. To have a customized capacitance, the bitcells may be custom made to achieve the desired capacitance. One manner of obtaining the desired capacitance is to custom design each cell having only as many switches as required to generate the required RF capacitance, e.g. these partial cells contained only ½, ¼, ⅛, etc. . . . of the number of switches compared to a full-cell. The capacitive load of the control lines of these partial cells then is also scaled down proportionally compared to the standard cells.

Typically a large-value isolation resistor is required between the control-electrodes and the CMOS driver to make sure that the control-electrodes are RF-floating, which ensures that the RF currents don't flow into the CMOS driver which would hurt the Q. In order to achieve this, the impedance of this isolation resistor must be several orders larger than the impedance of the control-electrode to the moveable MEMS element over the whole RF frequency range (0.5 . . . 3.5 GHz). Typical values of the isolation resistor range from 100 kOhm to 10 MOhm. Because these partial cells have a lower capacitance between the control-electrode and the moveable MEMS element, a larger value of the isolation resistor is needed to achieve the same RF performance. These increased isolation resistors exhibit more parasitic capacitances, which makes it hard for the CMOS control circuit to match the dynamic performance of these partial cells to the full cells.

Therefore, there is a need in the art for a DVC having a desired capacitance without parasitic capacitances.

SUMMARY OF THE INVENTION

Embodiments described herein provide for a method to scale the RF capacitance of the DVC cells without impacting the mechanical performance of the MEMS cells. Each cell has the same control capacitance irrespective of the RF capacitance. This allows each cell to use the same isolation resistor required for RF operation and thus each cell has the same parasitic capacitance. This allows the CMOS control circuit to be optimized and the dynamic performance of the cells to be matched. Several ranges of capacitance (different part numbers or products) can therefore reuse the same controller circuitry. In addition, trimming of the final minimum and maximum capacitance can be accomplished to center the process variation about the specification limits thus maximizing the yield. Lastly, a generalized capacitance array can be used and subsequently trimmed to quickly respond to customer requests saving new product development time.

In one embodiment, a variable capacitor comprises a substrate; one or more bond pads disposed over the substrate; a first cell disposed over the substrate and coupled to the one or more bond pads; and a second cell disposed over the substrate and coupled to the one or more bond pads. The first cell has a first end and a second end and comprises an RF electrode coupled to the one or more bond pads and the first end of the first cell; a plurality of MEMS devices disposed over the RF electrode, each MEMS device having a first end and a second end and each MEMS device disposed over the RF electrode; and one or more ground electrodes coupled to the first end and the second end of each MEMS device and to the second end of the first cell. The second cell has a first end and a second end and comprises an RF electrode coupled to the one or more bond pads; a plurality of MEMS devices disposed over the RF electrode, each MEMS device having a first end and a second end and less than all of the MEMS devices are disposed over the RF electrode; and one or more ground electrodes coupled to the first end and the second end of each MEMS device and to the second end of the first cell.

In another embodiment, a variable capacitor comprises a substrate; one or more bond pads disposed over the substrate; a first cell disposed over the substrate and coupled to the one or more bond pads; and a second cell disposed over the substrate and coupled to the one or more bond pads. The first cell has a first capacitance, a first end and a second end and comprising: an RF electrode coupled to the one or more bond pads and the first end of the first cell; a first plurality of MEMS devices disposed over the RF electrode, each MEMS device having a first end and a second end; and one or more ground electrodes coupled to the first end and the second end of each MEMS device and to the second end of the first cell. The second cell has a second capacitance that is less than the first capacitance, a first end and a second end and comprising: an RF electrode coupled to the one or more bond pads; a second plurality of MEMS devices disposed over the RF electrode, each MEMS device having a first end and a second end; and one or more ground electrodes coupled to the first end and the second end of each MEMS device and to the second end of the first cell. The second plurality of MEMS devices is equal to the first plurality of MEMS devices.

In another embodiment, a variable capacitor comprises a substrate; one or more bond pads disposed over the substrate; a first cell disposed over the substrate and coupled to the one or more bond pads; and a second cell disposed over the substrate and coupled to the one or more bond pads. The first cell has a first end and a second end and comprising: an RF electrode coupled to the one or more bond pads and the first end of the first cell, the RF electrode having a first length; a plurality of MEMS devices disposed over the RF electrode, each MEMS device having a first end and a second end; and one or more ground electrodes coupled to the first end and the second end of each MEMS device and to the second end of the first cell. The second cell has a first end and a second end and comprising: an RF electrode coupled to the one or more bond pads, the RF electrode having a second length that is less than the first length; a plurality of MEMS devices disposed over the RF electrode, each MEMS device having a first end and a second end; and one or more ground electrodes coupled to the first end and the second end of each MEMS device and to the second end of the first cell. The first cell and the second cell have cavities having substantially the same volume.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein provide for a method to scale the RF capacitance of the DVC cells without impacting the mechanical performance of the MEMS cells. Each cell has the same control capacitance irrespective of the RF capacitance. This allows each cell to use the same isolation resistor required for RF operation and thus each cell has the same parasitic capacitance. This allows the CMOS control circuit to be optimized and the dynamic performance of the cells to be matched.

The embodiments disclosed herein allow the partial cells to be designed exactly the same as the full-length cell, but with a reduced RF capacitance to achieve the binary scaling. The moveable MEMS element above the RF-line is designed as a full-length cell and will mechanically behave identical to the standard full-length cells when actuated because the control capacitances of the actuation electrodes are not affected. It will then be easier to match the dynamic behavior of each individual cell. Another advantage is that the total RF capacitance of the DVC array can be easily scaled by scaling the RF-line of each cell in the array with only 1 mask-change. This allows use of the same CMOS wafers for multiple products which have a different RF-capacitance by choosing the appropriate mask quite late in the process flow.

Figure 1:
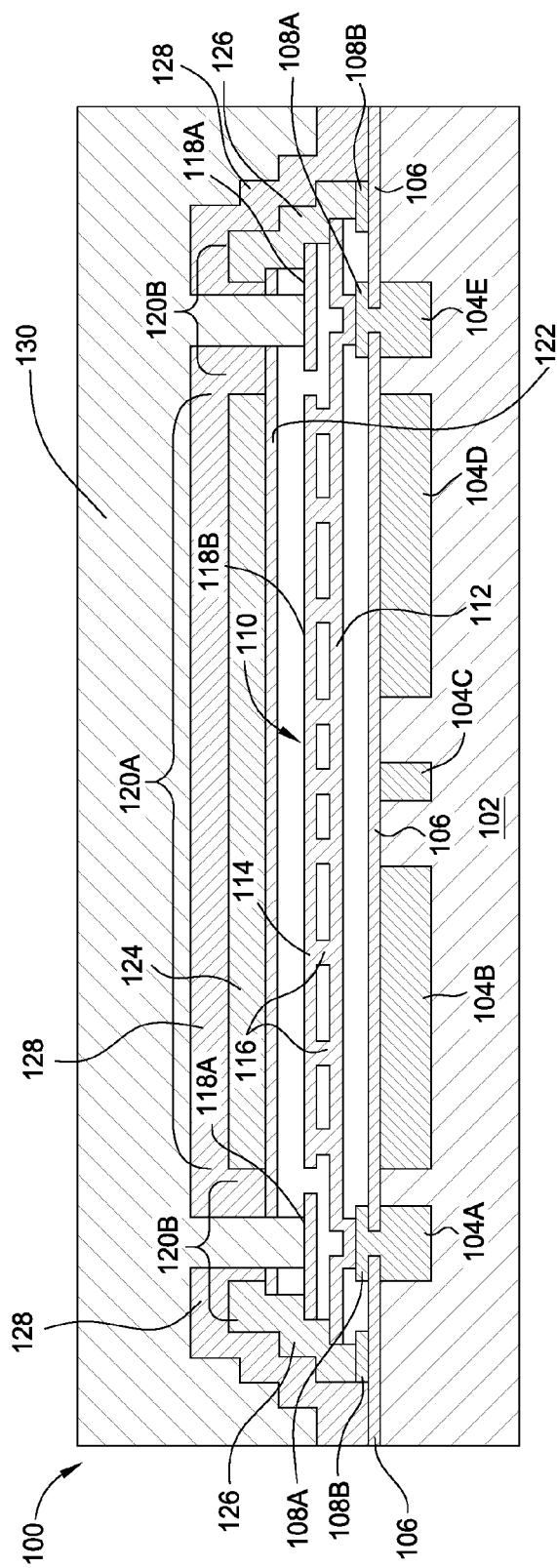
FIG. 1 is a schematic cross-sectional view of a MEMS device according to one embodiment.

FIG. 1 is a schematic cross-sectional view of a MEMS device 100 according to one embodiment. The MEMS device 100 is fabricated by forming grounding electrodes 104A, 104E, control/pull-in electrodes 104B, 104D and an RF electrode 104C. It is to be understood that while two grounding electrodes 104A, 104E and two control electrodes 104B, 104D have been shown, it is contemplated that a single grounding electrode and a single control electrode may be utilized. The substrate 102 may comprise a single layer material such as a semiconductor based substrate for a stand-alone MEMS device or generically a multilayer structure such as is produced in a back end of the line (BEOL) process. In one embodiment, the substrate 102 may comprise a CMOS substrate. Suitable materials that may be used for the electrodes 104A-104E include electrically conductive materials commonly utilized in BEOL processes such as copper, aluminum, titanium, tantalum, tungsten, titanium nitride, aluminum nitride, tungsten nitride and combinations thereof. The electrodes 104A-104E may be formed by well known deposition methods such as physical vapor deposition (PVD), chemical vapor deposition (CVD), electroplating and atomic layer deposition (ALD) and well known patterning methods such as etching or well known dual damascene processing steps. The control electrodes 104B, 104D, will function as pull-in electrodes to move the switching element into a position adjacent the RF electrode 104C.

Over the electrodes 104A-104E, a thin dielectric layer 106 is deposited and then patterned to expose the ground electrodes 104A, 104E. Suitable materials that may be utilized for the thin dielectric layer 106 include silicon nitride, silicon carbide, silicon oxide, alumina, silicon oxynitride, and other dielectric materials suitable for use in a CMOS device. The dielectric layer 106 may be deposited by well known deposition methods including CVD and ALD. The thin dielectric layer 106 is useful for several reasons including: reducing sticking of the switching element to the electrodes 104B-104D and reducing recombination of etching gas ions when removing sacrificial material that will be discussed below.

Over the thin dielectric layer 106, electrically conductive material may be blanket deposited and then patterned to form the electrical interconnects 108A to the ground electrodes 104A, 104E. Additionally, the electrically conductive material may be patterned to form pads 108B that may be utilized as a seed material for deposition of anchoring material to be deposited at a later time. Suitable materials for the electrical interconnects 108A and pads 108B include electrically conductive materials commonly utilized in BEOL processes such as copper, aluminum, titanium, tantalum, tungsten, titanium nitride, tungsten nitride, aluminum nitride and combinations thereof. The electrically conductive material may be deposited by well known deposition methods such as PVD, CVD, electroplating and ALD and then patterned by well known patterning methods such as etching.

A sacrificial material is then deposited over the exposed dielectric layer 106 as well as the electrical interconnects 108A and pads 108B. It is contemplated that an adhesion promoter may be deposited over the dielectric layer 106 prior to deposition of the sacrificial material to help adhere the sacrificial material thereto. Suitable materials for the sacrificial material include spin-on glass or spin on dielectric containing a long chain molecule with a carbon backbone. The sacrificial material may be deposited by well known deposition methods such as spin coating, CVD and ALD. The sacrificial material is termed a sacrificial material because the material is used to at least partially define the cavity and will be removed at a later time in the production process. Thus, the sacrificial material is used and 'sacrificed' or removed to form a cavity.

After deposition of the sacrificial material, the switching element 110 may then be formed. The switching element 110 may comprise a multilayer structure including a first structural layer 112. The first structural layer 112 is coupled to the electrical interconnects 108A and spans the length between the electrical interconnects 108A. A second structural layer 114 is then disposed over the first structural layer 112 and coupled to the first structural layer 112 by a plurality of posts 116. Suitable materials that may be used for the first structural layer 112, second structural layer 114 and posts 116 include titanium nitride, titanium aluminum, tungsten, copper, titanium aluminum nitride, aluminum and combinations thereof and multilayer structures such as titanium nitride/titanium aluminum nitride/titanium nitride. The first switching element 110 may be formed by depositing the material using well known deposition methods such as PVD, CVD, and ALD and then patterning the material by well known patterning methods such as etching. The second structural layer 114 is patterned to have a first portion 118A that is axially aligned with the ground electrodes 104A, 104E and a second portion 1188 that will be part of the flexible portion 120A of the switching element 110. As completed, the switching element 110 has a waffle-like appearance.

Additional sacrificial material may be deposited over the switching element 110 and in between formation of the first structural layer 112 and the second structural layer 114. The additional sacrificial material, together with the first deposited sacrificial material, defines the shape and boundary of the cavity within which the switching element 110 will move. Over the last deposited sacrificial material, a second dielectric layer 122 may then be deposited. The second dielectric layer 122 may be deposited using well known deposition methods and materials as discussed above with regards to dielectric layer 106.

The second dielectric layer 122 is then patterned and etched to define the outline of the cavity. In the same step, the sacrificial layers are etched whereby the structural layers 118A, 112 serve as a hardmask to provide a gradual step-down of the cavity sidewalls. This multi-step step-down improves the integrity of the cavity walls 126.

An electrically conductive material is then deposited and patterned to form the pull-off electrode 124 as well as the cavity walls 126. Thus, during the same deposition, the material used to form both the pull-off electrode 124 as well as the cavity walls 126 is deposited. During the patterning, the pull-off electrode 124 and the cavity walls 126 become separate elements. It is to be understood that while the pull-off electrode 124 is shown to be above the switching element 110, the pull-off electrode 124 may be electrically connected to a material that is disposed below the switching element 110. Additionally, the cavity walls 126 are grounded through the ground electrodes 104A, 104E. Suitable materials for the electrically conductive material include electrically conductive materials commonly utilized in BEOL processes such as copper, aluminum, titanium, tantalum, tungsten, titanium nitride, and combinations thereof. The electrically conductive material may be deposited by well known deposition methods such as PVD, CVD, and ALD and the patterned by well known patterning methods such as etching.

After the electrically conductive material is patterned, a dielectric roof 128 may be deposited over the electrically conductive material. The dielectric roof 128 provides electrical isolation between the pull-off electrode 122 and the walls 126 that comprise the electrically conductive material. The dielectric roof 128 encapsulates the MEMS device 100. The dielectric roof 128 may be deposited using well known deposition methods and materials as discussed above with regards to dielectric layer 106. It is contemplated that the electrically conductive material that is used to form the cavity walls 126 may be eliminated from the cavity walls 126 such that the dielectric roof 128 is deposited in sufficient quantity to form the cavity walls 126.

One or more release holes may then be formed through the dielectric roof 128, and the second dielectric layer 122. An etching gas is then introduced to remove the sacrificial material and free the switching element to move within the cavity. Suitable etching gases that may be used include $H_2$, $NH_3$, $O_2$, $O_3$, $N_2O$ or any other etching gas that produces H, O, or N. The cavity is then sealed by depositing a sealing layer 130 over the dielectric roof 128 and within the release holes.

In operation, the switching element 110 is moved by applying an electrical bias to either the pull-in electrodes 104B, 104D or to the pull-off electrode 124. The flexible portion 120A (118B) of the switching element 110 moves while the anchor portion 120B (118A) is fixedly attached to the ground electrodes 104A, 104E. The sealing layer 130 and the electrically conductive walls 126 both provide additional leverage to ensure the anchor portion 120B does not detach from the ground electrodes 104A, 104E. Both ends of the switching element 110 have anchoring portions 120B and both anchoring portions 120B are directly coupled to both the sealing layer 130 as well as the electrically conductive material that was deposited to form the pull-off electrode 124.

The MEMS device 100 described above is an embodiment of a MEMS device that is utilized in a MEMS variable capacitor device for RF and microwave applications, where minimizing parasitic and losses is of primary concern. The MEMS device 100 may be used in a MEMS based variable capacitor that is integrated in a sealed cavity embedded within a CMOS back-end.

There are several advantages to utilizing the MEMS device 100 in a variable capacitor. One advantage is the trade-off between minimizing the losses (i.e., best Q factor) and minimizing unwanted capacitive coupling (i.e., best capacitance tuning ratio) is superior to alternative traditional device architectures. Another advantage is that the fabrication of a sealed cavity is facilitated due to the narrow and long shape of the cavity, which helps both release and structural strength. Additionally, hierarchical grouping allows the definition of control groups (i.e., devices which share the same control electrode) tailored to the resolution requirements of the digital variable capacitor (i.e., minimum step size in the variation of capacitance vs. control).

Figure 2:
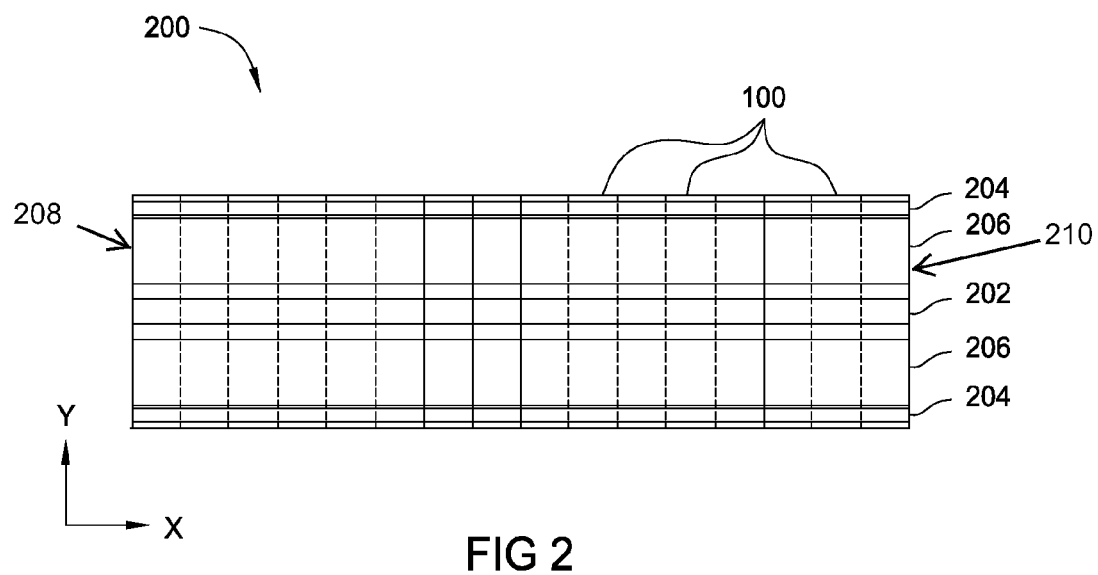
FIG. 2 is a schematic illustration of a cell according to one embodiment.

The arrangement of MEMS variable capacitor devices is done by generating a first grouping hierarchy named a cell. FIG. 2 is a schematic illustration of a DVC cell 200. The cell 200 will comprise a plurality of MEMS devices 100 that are collectively within a common cavity. The MEMS devices 100 will share an RF electrode 202 as well as one or more control electrodes 206 and one or more ground electrodes 204. Each of the electrodes 202, 204, 206 will be arranged within the cell 200 parallel to each other. The MEMS devices 100 will be arranged such that the second portion 118B of the MEMS devices 100 extends from the ground electrodes 204 in a direction perpendicular to the RF electrode 202, control electrodes 206 and ground electrodes 204. As will be discussed below, the RF electrode 202 is connected to an RF bump at a first side 208 of the DVC cell 200 while electrodes 204, 206 are connected at a second side 210. All MEMS devices 100 (generically shown by the dashed lines) which are part of one cell 200 have the following characteristics. All MEMS devices in one cell 200 share the same sealed cavity. A moveable MEMS device 100 is connected to electrode 204 and moves out-of-plane to vary the capacitance between electrodes 202 and 204. This movement is induced by a voltage between electrode 206 and the moveable element connected to electrode 204 which results in electrostatic forces.

Figure 3:
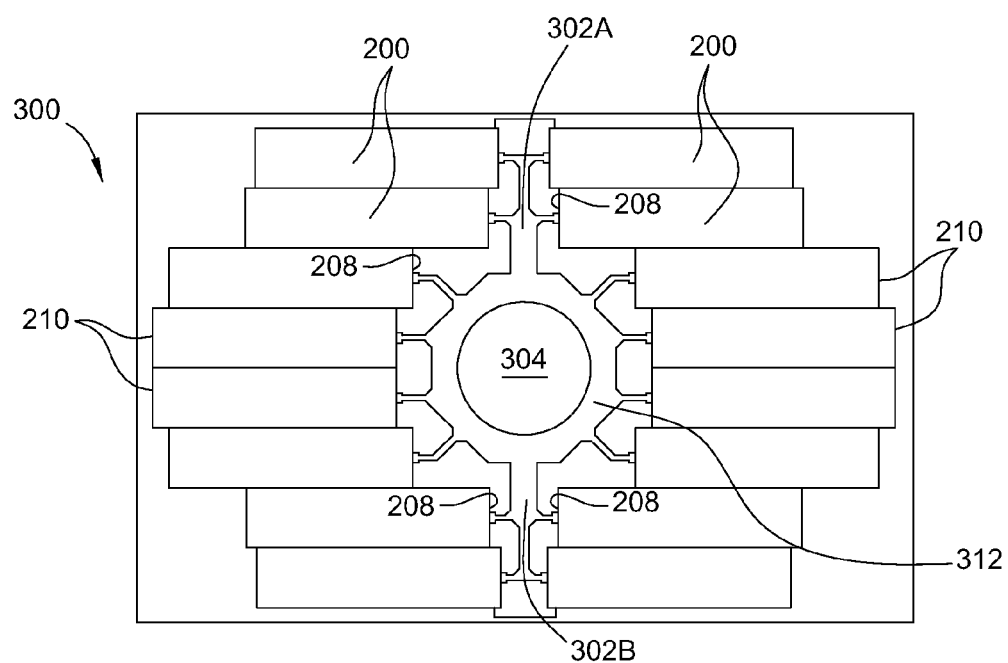
FIG. 3 shows an example device with a plurality of DVC cells arranged around a common RF bump pad according to one embodiment.

FIG. 3 shows an example device 300 with a plurality of DVC cells 200 arranged around a common RF bump pad 304. Each cell 200 will have one or more MEMS devices 100 therein that share the common RF electrode 202. Each cell 200 is individually connected to a corresponding branch 302A-302B (that extends from a trunk 312) or directly to the RF pad 304 on a first end 208 to provide the RF connection to the individual cells 200. The ground and control routing is connected at the opposite side 210 of the cells 200.

Figure 4:
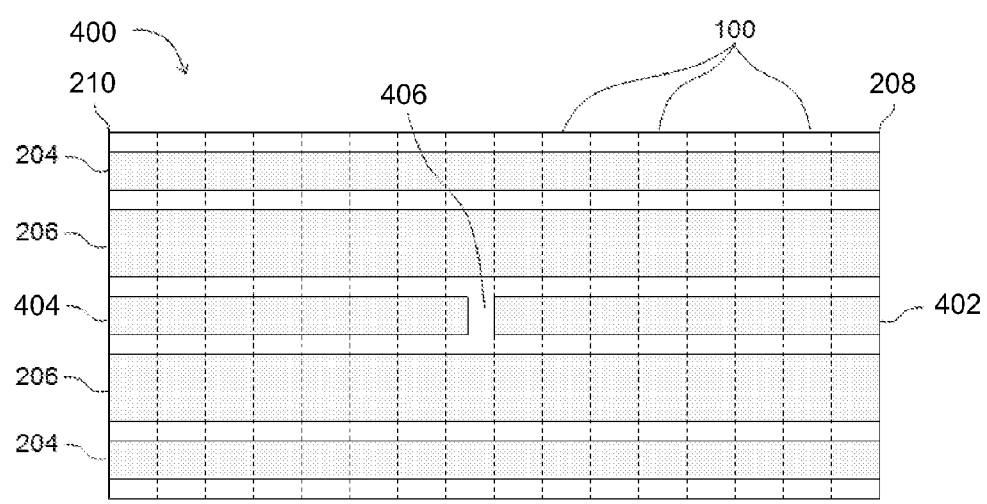
FIG. 4 shows a DVC cell having a trimmed RF line according to one embodiment.

FIG. 4 shows a DVC cell 400 having a trimmed RF line. The DVC cell 400 contains the same number of MEMS switches 100 as are present in DVC cell 200. However, a cut was made in the RF line to result in two RF-lines 402 and 404 separated by a gap 406. RF-line 402 is connected to the RF-bump at side 208 of the DVC-cell. Because of the reduced area of the RF-line 402 the RF-capacitance of this DVC cell 400 is reduced proportionally. RF-line 404 is connected to electrode 204 (the moveable MEMS element) at side 210 to ensure no electrostatic forces coming from RF-line 404. Thus, RF electrode 404 may be considered a ground electrode.

The MEMS switches 100 with RF-electrode 402 are active switches since these actively tune the capacitance between RF-electrode 402 and electrode 204. The MEMS switches 100 with RF-electrode 404 are dummy switches as these do not contribute to the RF-capacitance between RF-electrode 402 and electrode 204.

The gap 406 should be sufficiently large to minimize RF-coupling from RF-line 402 to RF-line 404. Typically a distance of a few (i.e., about 1 to about 10) micrometer is sufficient, since RF-line 402 couples to the moveable element above the electrodes at a close distance. The gap 406 should not be made too large as the contact surface in the gap 406 may be at a different height compared to the contact surface along the RF-lines 402, 404. This is due to the differences in CMP rate in these regions during fabrication. If the gap 406 is too large, then the corresponding switch 100 in this region may be pulled-down lower than neighboring switch 100 with RF-electrode 402. This may put a torque on the MEMS element out-of-plane and affect the RF performance (Capacitance, linearity, etc. . . . ). By limiting the gap 406 to a few micrometer, the switches on either side of the gap are supporting the switch in the gap-area and this effect can be minimized.

From FIG. 4 it is clear that the total area of the control lines 206 is still the same as in FIG. 2, resulting in the same capacitive load seen by the CMOS driver connected to electrodes 206. This allows to scale the area of RF-line 402 connected to the RF-bump at side 208 from 0 to all the switches in the cavity without affecting the mechanical performance of the device upon actuation.

This allows the partial cells to be designed with the cut placed such to result in ½, ¼, ⅛, etc. . . . of the capacitance of electrode 202 in these particular cells, but still have the same dynamic performance as the other full-cells in the array. In addition this allows design of a DVC cell with a sufficiently large number of switches to cover a range of products, all using the same CMOS wafers. During the later stages of fabrication, only the mask that defines the electrodes 202, 204, 206, 402, 404 needs to be chosen such that it defines the correct number of active switches for the product. In this way the same CMOS wafers can be used for more product capacitance ranges late in the process flow.

Thus, the cells 200, 400 may be substantially identical in size and with an identical number of MEMS elements 100 therein. However, the RF electrodes 202, 402, 404 are different. Specifically, the pull-in electrodes 206 of the cells 200, 400 can have identical lengths; the ground electrodes 204 of the cells 200, 400 can have identical lengths; and the number of MEMS elements 100 of the cells 200, 400 can be identical. In other words, the cells 200, 400 can be substantially identical except for the RF electrodes 202, 402, 404 where the RF electrode 202 of cell 200 is longer than the RF electrode 402 of cell 400. Additionally, RF electrode 404, which is coupled to ground through ground electrodes 204, is adjacent RF electrode 402, but spaced by a distance of between about 2 micrometers to about 10 micrometers. By arranging cells 200, 400 in such a manner, cell 200 and cell 400 each have a different capacitance. Additionally, the ground electrodes 204 and the pull-in electrodes 206 are longer than RF electrode 402. Because only the RF electrodes 202, 402, 404 are different, DVC cells of substantially identical size, with a substantially identical number of switches can be fabricated over a CMOS substrate easily by simply changing 1 mask (i.e., the mask utilized to define the shape of the RF electrode).

The embodiments disclosed herein allows the partial cells to be designed exactly the same as the full-length cell, but with a reduced RF capacitance to achieve the binary scaling. The moveable MEMS element above the RF-line is designed as a full-length cell and will mechanically behave identical to the standard full-length cells when actuated because the control capacitances of the actuation electrodes are not affected. It will then be easier to match the dynamic behavior of each individual cell. Another advantage is that the total RF capacitance of the DVC array can be easily scaled by scaling the RF-line of each cell in the array with only 1 mask-change. This allows use of the same CMOS wafers for multiple products which have a different RF-capacitance by choosing the appropriate mask quite late in the process flow.

While the foregoing is directed to embodiments of the present invention, other and further embodiments of the invention may be devised without departing from the basic scope thereof, and the scope thereof is determined by the claims that follow.

The invention claimed is:

1. A variable capacitor, comprising: a substrate;
one or more bond pads disposed over the substrate; a first cell disposed over the substrate and coupled to the one or more bond pads, the first cell having a first end and a second end and comprising:
an RF electrode coupled to the one or more bond pads and the first end of the first cell;
a plurality of MEMS devices disposed over the RF electrode, each MEMS device having a first end and a second end and each MEMS device disposed over the RF electrode; and
one or more ground electrodes coupled to the first end and the second end of each MEMS device and to the second end of the first cell; and
a second cell disposed over the substrate and coupled to the one or more bond pads, the second cell having a first end and a second end and comprising: an RF electrode coupled to the one or more bond pads; a plurality of MEMS devices disposed over the RF electrode, each MEMS device having a first end and a second end and less than all of the total MEMS devices in the second cell are disposed over the RF electrode; and one or more ground electrodes coupled to the first end and the second end of each MEMS device and to the second end of the first cell.

2. The variable capacitor of claim 1, wherein the second cell additionally comprises a pull-in electrode having a length that is greater than the RF electrode of the second cell.

3. The variable capacitor of claim 1, wherein the second cell further comprises a ground electrode disposed adjacent the RF electrode.

4. The variable capacitor of claim 3, wherein RF electrode is spaced from the ground electrode by a distance of between about 1 micrometers to about 10 micrometers.

5. The variable capacitor of claim 1, wherein the first cell and the second cell each have a different capacitance.

6. The variable capacitor of claim 5, wherein the second cell additionally comprises a pull-in electrode having a length that is greater than the RF electrode of the second cell.

7. The variable capacitor of claim 1, wherein each cell is a sealed cavity that includes the plurality of MEMS devices collectively enclosed within the sealed cavity.

8. A variable capacitor, comprising:
a substrate;
one or more bond pads disposed over the substrate;
a first cell disposed over the substrate and coupled to the one or more bond pads, the first cell having a first capacitance, a first end and a second end and comprising:
an RF electrode coupled to the one or more bond pads and the first end of the first cell;
a first plurality of MEMS devices disposed over the RF electrode, each MEMS device having a first end and a second end; and
one or more ground electrodes coupled to the first end and the second end of each MEMS device and to the second end of the first cell; and
a second cell disposed over the substrate and coupled to the one or more bond pads, the second cell having a second capacitance that is less than the first capacitance, a first end and a second end and comprising:
an RF electrode coupled to the one or more bond pads;
a second plurality of MEMS devices disposed over the RF electrode, each MEMS device having a first end and a second end, the second plurality of MEMS devices is equal to the first plurality; and
one or more ground electrodes coupled to the first end and the second end of each MEMS device and to the second end of the first cell.

9. The variable capacitor of claim 8, wherein the second cell additionally comprises a pull-in electrode having a length that is greater than the RF electrode of the second cell.

10. The variable capacitor of claim 8, wherein the second cell further comprises a ground electrode disposed adjacent the RF electrode.

11. The variable capacitor of claim 10, wherein RF electrode is spaced from the ground electrode by a distance of between about 1 micrometers to about 10 micrometers.

12. The variable capacitor of claim 11, wherein each cell is a sealed cavity that includes the plurality of MEMS devices collectively enclosed within the sealed cavity.

13. The variable capacitor of claim 12, wherein the second cell additionally comprises a pull-in electrode having a length that is greater than the RF electrode of the second cell.

14. The variable capacitor of claim 8, wherein each cell is a sealed cavity that includes the plurality of MEMS devices collectively enclosed within the sealed cavity.

15. A variable capacitor, comprising: a substrate;
one or more bond pads disposed over the substrate; a first cell disposed over the substrate and coupled to the one or more bond pads, the first cell having a first end, a second end, a first volume and comprising:
an RF electrode coupled to the one or more bond pads and the first end of the first cell, the RF electrode having a first length;
a plurality of MEMS devices disposed over the RF electrode, each MEMS device having a first end and a second end; and
one or more ground electrodes coupled to the first end and the second end of each MEMS device and to the second end of the first cell; and
a second cell disposed over the substrate and coupled to the one or more bond pads, the second cell having a first end, a second end, and a second volume substantially equal to the first volume and comprising:
an RF electrode coupled to the one or more bond pads, the RF electrode having a second length that is less than the first length;
a plurality of MEMS devices disposed over the RF electrode, each MEMS device having a first end and a second end, and at least one MEMS device disposed in a section of the second volume where the RF electrode is not disposed; and
one or more ground electrodes coupled to the first end and the second end of each MEMS device and to the second end of the first cell.

16. The variable capacitor of claim 15, wherein the second cell additionally comprises a pull-in electrode having a third length that is greater than the second length.

17. The variable capacitor of claim 16, wherein the first cell additionally comprises a pull-in electrode having a fourth length that is equal to the second length.

18. The variable capacitor of claim 15, wherein the second cell further comprises a ground electrode disposed adjacent the RF electrode.

19. The variable capacitor of claim 18, wherein RF electrode is spaced from the ground electrode by a distance of between about 1 micrometers to about 10 micrometers.

20. The variable capacitor of claim 15, wherein each cell is a sealed cavity that includes the plurality of MEMS devices collectively enclosed within the sealed cavity.

* * * * *